(12) United States Patent
Nishino

(10) Patent No.: US 7,492,224 B2
(45) Date of Patent: Feb. 17, 2009

(54) GAIN VARIABLE CIRCUIT AND AUTOMATIC GAIN CONTROL AMPLIFIER USING THE SAME

(75) Inventor: Akira Nishino, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 11/640,858

(22) Filed: Dec. 19, 2006

(65) Prior Publication Data

US 2007/0139114 A1 Jun. 21, 2007

(30) Foreign Application Priority Data

Dec. 20, 2005 (JP) ............... 2005-365933

(51) Int. Cl.
*H03F 3/45* (2006.01)
(52) U.S. Cl. ...................... 330/254; 330/253
(58) Field of Classification Search ................ 330/253, 330/254; 327/359
See application file for complete search history.

(56) References Cited

U.S. PATENT DOCUMENTS 5,751,177 A 5/1998 Tanoi 5,896,063 A * 4/1999 Marsh et al. ................. 330/254
6,177,839 B1 * 1/2001 Ishihara ....................... 330/254
7,199,661 B1 * 4/2007 Shirvani-Mahdavi et al. ........................... 330/254

FOREIGN PATENT DOCUMENTS

JP 9018329 1/1997

OTHER PUBLICATIONS

M. Moller et al., 13Gb/s Si-Bipolar AGC Amplifier IC with High Gain and Wide Dynamic Range for Optical-Fiber Receivers,, IEEE Journal of Solid-state Circuits, vol. 29,Jul. 1994.

* cited by examiner

*Primary Examiner*—Khanh V Nguyen
(74) *Attorney, Agent, or Firm*—Volentine & Whitt, P.L.L.C.

(57) ABSTRACT

A gain variable circuit includes a first load between a first supply voltage and a first output terminal outputting a first output signal; a second load between the first supply voltage and a second output terminal outputting a second output signal with phase reversed from the first output signal; a first differential circuit between the first and second output terminals and a first node that changes gains of the first and second output signals based on first and second complementary gain variable signals; a second differential circuit between the first and second output terminals and a second node that changes gains of the first and second output signals based on the first and second gain variable signals; and an amplification circuit between the first and second nodes and a second supply voltage node that amplifies the first and second output signals based on first and second complementary input signals.

6 Claims, 4 Drawing Sheets

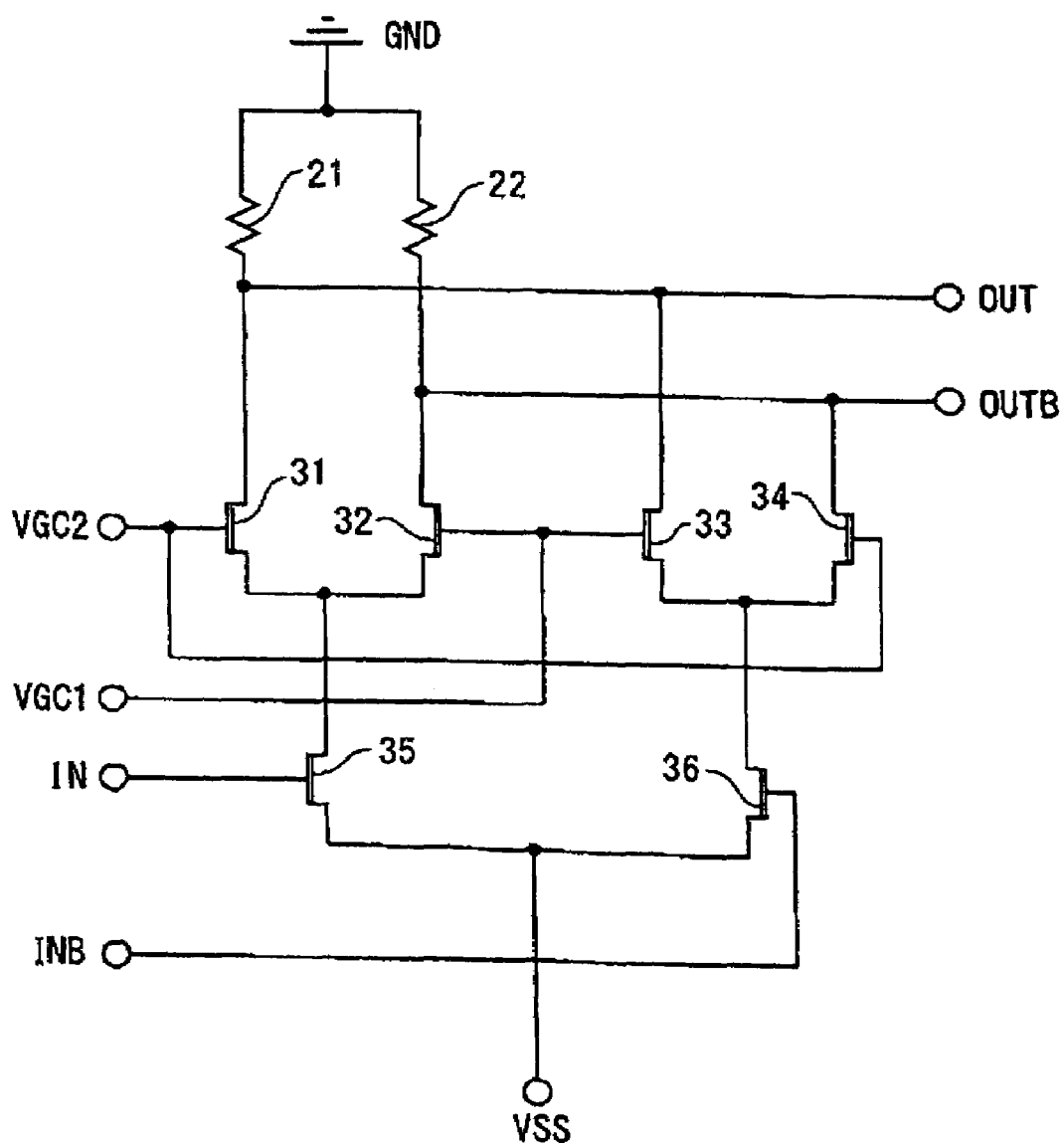
F I G. 2

GAIN VARIABLE CIRCUIT AND AUTOMATIC GAIN CONTROL AMPLIFIER USING THE SAME

BACKGROUND OF THE INVENTION

1. Field of the Invention

The present invention relates to a gain variable circuit that can operate at low voltage relative to a differential signal, and to an automatic gain control amplifier (hereafter, "AGC amp") using the same.

2. Related Art

Conventionally-known technologies relating to gain variable circuits are known, for example, the technologies recited in the following publications:

Non-patent Publication 1: M. Moller, H. -M. Rein and H. Wernz, "13 Gb/s Si-Bipolar AGC Amplifier IC with High Gain and Wide Dynamic Range for Optical-Fiber Receivers", *IEEE Journal of Solid-state Circuits*, Vol. 29, No. 7, July 1994, pp. 815-822; and Patent Publication 1: JP-A No. 9-18329.

In FIG. 2(a) on p. 817 of Non-patent Publication 1, a circuit diagram of a gain variable circuit formed from bipolar transistors is disclosed. The circuit diagram of an AGC amp using this gain variable circuit is disclosed in FIG. 1 on p. 816 of the same publication.

Further, in FIG. 3 of Patent Publication 1, the circuit configuration diagram of a Gilbert-type multiplier (a double balanced-type differential amplifier) that uses an electric field effect transistor (hereafter "FET") of the same circuit configuration as the gain variable circuit of Non-patent Publication 1 is disclosed. This multiplier is a circuit into which two analog signals are inputted and which then outputs an output signal that proportions the product of these. Its applications differ from that of a gain variable circuit.

FIG. 4 is a circuit diagram showing a conventional gain variable circuit.

This gain variable circuit is a circuit in which the gain variable circuit formed from the bipolar transistor recited in Non-patent Publication 1 is replaced with an FET in order to simplify the explanations.

The gain variable circuit of FIG. 4 has: a positive-phase signal input terminal IN; a reverse-phase signal input terminal INB; a positive-phase signal output terminal OUT; a reverse-phase signal output terminal OUTB; gain variable terminals VGC1, VGC2; and a supply terminal VD. Between these terminals, two load resistors 1, 2 and seven FETs 11-17 are connected.

One of terminals of each of the load resistors 1, 2 is connected to the supply terminal VD. The other terminal of the load resistor 1 and the drains of the FETs 11, 13 are connected to the output terminal OUTB, and the other terminal of the load resistor 2 and the drains of the FETs 12, 14 are connected to the output terminal OUT. The gates of the FETs 11, 14 are connected to the gain variable terminal VGC1 and the gates of the FETs 12, 13 are connected to the gain variable terminal VGC2. The sources of the FETs 11, 12 are connected to the drain of the FET 15 and the sources of the FETs 13, 14 are connected to the drain of the FET 16. The gate of the FET 15 is connected to the input terminal IN and the gate of the FET 16 is connected to the input terminal INB. The sources of the FETs 15, 16 are connected to the drain of the FET 17 and the gate and the source of this FET 17 are connected to the ground GND.

With this gain variable circuit, the constant current source is formed from the FET 17, the differential circuit for signal amplification is formed from the FETs 15 and 16, and the differential circuit for gain variation is formed from FETs 11-14.

In this type of circuit configuration, the FET 15 and 16 are made to have the same characteristics, and each of the FET 11, 12, 13, 14 are made to have the same characteristics.

Here, the input signal voltage applied to the positive-phase signal input terminal IN is vin and the input signal voltage applied to the reverse-phase signal input terminal INB is −vin, and the difference of the gain variable voltage applied to the gain variable terminals VGC1 and VGC2 is vgc. The constant current that flows to the FET 17 drain is i, the resistance value of load resistors 1 and 2 is r, the drain current dependency of the reciprocal conductance of the FET 15 and 16 is A1, and the drain current dependency of the reciprocal conductance of each of the FET 11, 12, 13, 14 is A2.

Drain current I15 of the FET 15 is derived by:

$$I15 = i \cdot [1 + A1 \cdot \{vin - (-vin)\}/2]/2 \qquad (1)$$
$$= i \cdot (1 + A1 \cdot vin)/2$$

Drain current I16 of the FET 16 is derived by:

$$I16 = i \cdot [1 + A1 \cdot \{(-vin) - vin\}/2]/2 \qquad (2)$$
$$= i \cdot (1 - A1 \cdot vin)/2$$

Drain current I11 of the FET 11 is derived by:

$$I11 = I15 \cdot (1 + A2 \cdot vgc/2)/2 \qquad (3)$$
$$= i \cdot (1 + A1 \cdot vin) \cdot (1 + A2 \cdot vgc/2)/4$$

Drain current I12 of the FET 12 is derived by:

$$I12 = I15 \cdot (1 - A2 \cdot vgc/2)/2 \qquad (4)$$
$$= i \cdot (1 + A1 \cdot vin) \cdot (1 - A2 \cdot vgc/2)/4$$

Drain current I13 of the FET 13 is derived by:

$$I13 = I16 \cdot (1 - A2 \cdot vgc/2)/2 \qquad (5)$$
$$= i \cdot (1 + A1 \cdot vin) \cdot (1 - A2 \cdot vgc/2)/4$$

Drain current I14 of the FET 14 is derived by:

$$I14 = I16 \cdot (1 + A2 \cdot vgc/2)/2 \qquad (6)$$
$$= i \cdot (1 - A1 \cdot vin) \cdot (1 + A2 \cdot vgc/2)/4$$

Further, the current I11 flowing to the load resistor 1 is the sum of the FET 11's drain current I11 and the FET 13's drain current I13, and that value becomes as follows due to Equations (3) and (5);

$$I1 = I11 + I13 \quad (7)$$
$$= i \cdot (1 - A1 \cdot A2 \cdot vin \cdot vgc/2)/2$$

The current I2 flowing to the load resistor 2 is the sum of the FET 12's drain current I12 and the FET 14's drain current I14, and that value becomes as follows due to Equations (4) and (6):

$$I2 = I12 + I14 \quad (8)$$
$$= i \cdot (1 + A1 \cdot A2 \cdot vin \cdot vgc/2)/2$$

Accordingly, if the change from the time where the vout vgc=0 of the output signal voltage outputted from the positive-phase signal output terminal OUT is made Δ vout, then Δ vout becomes:

$$\Delta vout = r \cdot A1 \cdot A2 \cdot vin \cdot vgc/4 \quad (9)$$

The change from the time where the voutb vgc=0 of the output signal voltage outputted from the reverse-phase signal output terminal OUTB is made Δ voutb, then Δ voutb becomes:

$$\Delta voutb = -r \cdot A1 \cdot A2 \cdot vin \cdot vgc/4 \quad (10)$$

In this manner, the circuit configured as described above operates as a gain variable circuit where the gain is varied by the difference vgc of the voltage applied to the gain variable terminal VGC1 and VGC2. Further, the FET 17 for constant current supply is provided. For this reason, even if, for example, the input signal voltage −vin applied to the reverse-phase signal input terminal INB is made into fixed voltage and the input signal voltage vin applied to the positive-phase signal input terminal IN is made into variable voltage, there is the advantageous point that a single pulse conversion function of the differential circuits for signal amplification that are the FET 15 and 16 works and stabilized line-form output voltage can be obtained.

Nonetheless, the conventional gain variable circuit comprises three tiers of vertical stacking of the FET 17 for constant current supply, the FET 15 and 16 of differential circuits for signal amplification, and the FETs 11-14 of the differential circuits for gain variation, as well as the load resistors 1 and 2. For this reason, there are a large number of elements, or, in order to power the FETs, the voltage between the necessary drain sources is made Vds and the voltage applied to the load resistors 1, 2 is made Vr, whereby the minimum supply voltage Vmin necessary becomes as follows:

$$V\text{min} = 3 \cdot Vds + Vr$$

This is problematic in that it is difficult to lower the power supply voltage lower than this.

The gain variable circuit is used when configuring various integrated circuits such as AGC amps and the like so, especially in this case, the above problem becomes a big obstacle in reducing the supply power voltage to the integrated circuits and curtailing the number of configured elements. Solving this problem has been difficult.

SUMMARY OF THE INVENTION

The gain variable circuit of the present invention comprises: a first load connected between a first supply voltage node and a first output terminal that outputs a first output signal; a second load connected between the first supply voltage node and a second output terminal that outputs a second output signal whose phase is reversed from that of the first output signal; a first differential circuit that is connected between the first and second output terminals and a first node and which changes the gains of the first and second output signals in accordance with a difference between first and second complementary gain variable signals; a second differential circuit that is connected between the first and second output terminals and a second node and which changes the gains of the first and second output signals in accordance with a difference between the first and second gain variable signals; and an amplification circuit that is connected between the first and second nodes and a second supply voltage node and which amplifies the first and second output signals in accordance with a difference between first and second complementary input signals.

The AGC amp of the present invention comprises: the gain variable circuit; a one-tier or multiple-tiered differential amplification circuit that differentially amplifies the first and second output signals of the gain variable circuit and outputs complementary third and fourth output signals; and a feedback circuit that feeds back and inputs the amount of variation of the third and fourth output signals to the gain variable circuit as the first and second gain variable signals.

With the gain variable circuit of the present invention, the number of vertically stacked elements in the first and second differential circuits and the amplification circuit can be decreased, whereby the power supply voltage can be reduced.

With the AGC amp of the present invention, the gain variable circuit is provided so the power supply voltage of the entire AGC amp can be reduced. For this reason, lower consumption of electrical power is possible due to the low-voltage operation of the entire AGC amp, whereby the circuit can be made more compact due to reductions in the numbers of elements.

BRIEF DESCRIPTION OF THE DRAWINGS

Exemplary embodiments of the present invention will be described in detail based on the following figures, wherein:

FIG. 2 is a circuit diagram of a gain variable circuit showing the second embodiment of the present invention;

DETAILED DESCRIPTION OF THE INVENTION

The variable gain circuit has: a first load resistor connected between a first supply voltage node and a first output terminal that outputs a first output signal; a second load resistor connected between the first supply voltage node and a second output terminal that outputs a second output signal whose phase is reversed from that of the first output signal; a first differential circuit that is connected between the first and second output terminals and the first node and which changes the gains of the first and second output signals in accordance with the difference between the complementary first and second gain variable signals; a second differential circuit that is connected between the first and second output terminals and a second node and which changes the gains of the first and second output signals in accordance with the difference between the first and second gain variable signals; and an amplification circuit that is connected between the first and second nodes and a second supply voltage node and which amplifies the first and second output signals in accordance with the difference between the complementary first and second output signals.

First Embodiment

Configuration of First Embodiment

Figure 1:
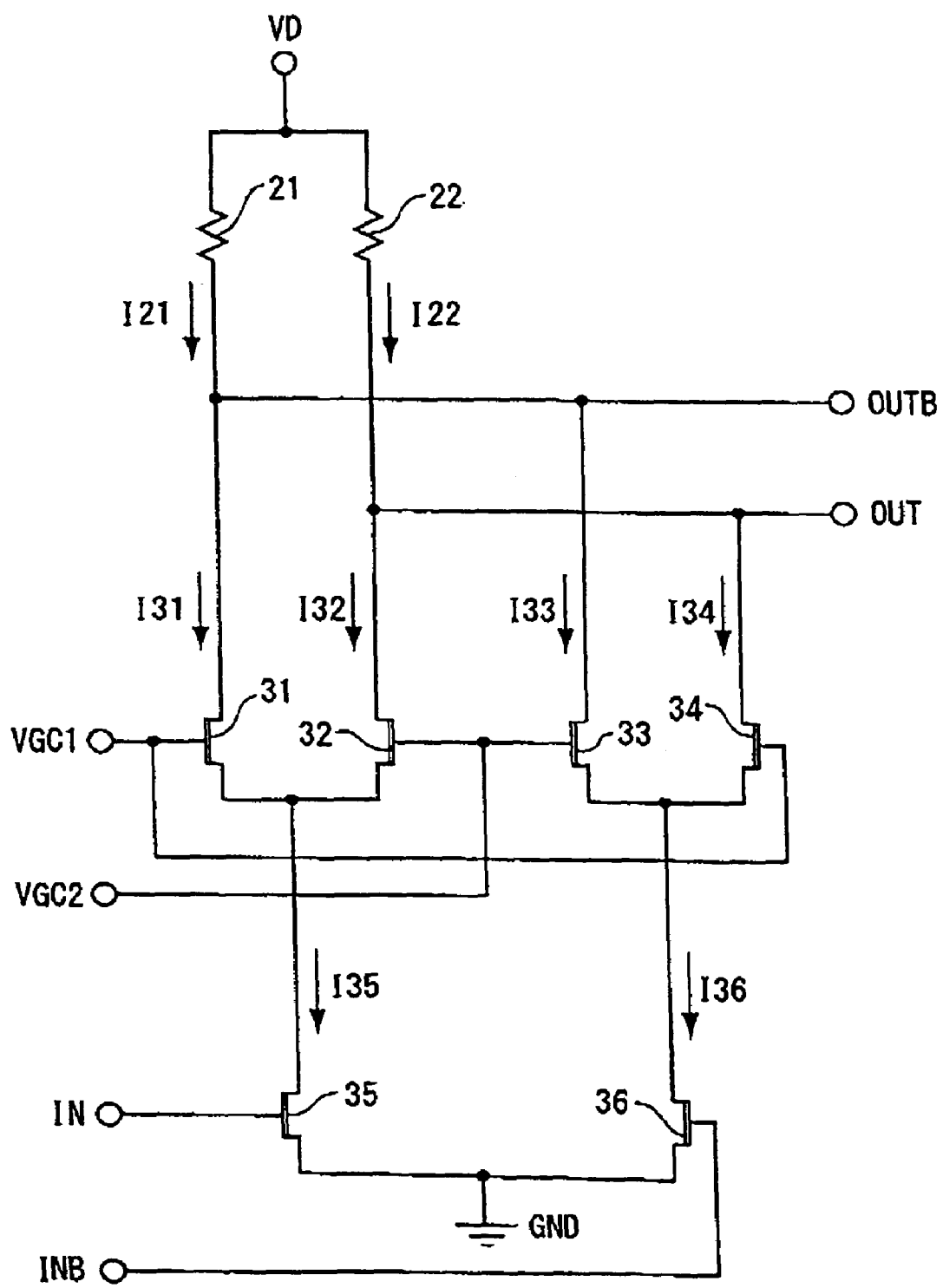
FIG. 1 is a circuit diagram of a gain variable circuit showing the first embodiment of the present invention.

FIG. 1 is a circuit diagram of a gain variable circuit showing the first embodiment of the present invention.

This gain variable circuit has: a positive-phase signal input terminal IN; a reverse-phase signal input terminal INB; a second output terminal OUT (e.g., a positive-phase signal output terminal); a first output terminal OUTB (e.g., a reverse-phase signal output terminal); a gain variable terminal VGC1 and VGC2 and a first supply voltage node VD (e.g., a supply terminal). Between these terminals, the following are connected; a first and second load (e.g., load resistors) 21, 22; a first differential circuit for gain variation made from first and second transistors (e.g., FETS) 31, 32; a second differential circuit for gain variation made from third and fourth transistors (e.g., FETs) 35, 36; and an amplification circuit (e.g., a source ground circuit for signal amplification) made from fifth and sixth transistors (e.g., FETs) 35, 36. With the first embodiment, by providing a source ground circuit for amplifying signals in place of a conventional differential circuit for amplifying signals, the number of vertically-stacked tiers of FETs becomes two tiers, and a reduction in the number of elements and decrease in power supply voltage are achieved.

One terminal of each of the load resistors 21, 22 is connected to a power supply terminal VD, and the other terminal of the load resistor 21 is connected to the FETs 31, 33's drain and to the output terminal OUTB. The other terminal of the load resistance 22 is connected to the FETs 32, 34's drain and to the output terminal OUT. The FETs 31, 34's gate is connected to the variable gain terminal VGC1 and the FETs 32, 33's gate is connected to the variable gain terminal VGC2. The first node at the source side of the FETs 31, 32 is connected to the FET 35's drain and the second node at the source side of the FETs 33, 34 is connected to the FET 36 drain The FET 35's gate is connected to the input terminal IN and the FET 36's gate is connected to the input terminal INB. The FETs 35, 36's source is connected to the second supply voltage node (ground GND).

Operation of First Embodiment

In the circuit configuration of FIG. 1, the FET 35 and 36 are made to have the same characteristics, and each of the FET 31, 32, 33, 34 are made to have the same characteristics. Here, the first input signal (e.g., input signal voltage) applied to the positive-phase signal input terminal IN is vin, and the second input signal (e.g., input signal voltage) applied to the reverse-phase signal input terminal INB is –vin, and the difference of the vgc1, vgc2 of the first and second gain variable signals (e.g., gain variable voltage) applied to the gain variable terminals VGC1 and VGC2 is vgc. The drain current of the FETs 35 and 36 when vin=–vin=0 is i/2, the resistance value of each of the load resistors 21, 22 is r, the drain current dependency of the reciprocal conductance of the FETs 35 and 36 is A1, and the drain current dependency of the reciprocal conductance of each of the FETs 31, 32, 33, 34 is A2.

Drain current I35 of the FET 35 is derived by:

$$I35 = i \cdot (1 + A1 \cdot vin)/2 \qquad (11)$$

Drain current I36 of the FET 36 is derived by:

$$I36 = i \cdot \{1 + A1 \cdot (-vin)\}/2 \qquad (12)$$
$$= i \cdot (1 - A1 \cdot vin)/2$$

Drain current I31 of the FET 31 is derived by:

$$I31 = I35 \cdot (1 + A2 \cdot vgc/2)/2 \qquad (13)$$
$$= i \cdot (1 + A1 \cdot vin) \cdot (1 + A2 \cdot vgc/2)/4$$

Drain current I32 of the FET 32 is derived by:

$$I32 = I35 \cdot (1 - A2 \cdot vgc/2)/2 \qquad (14)$$
$$= i \cdot (1 + A1 \cdot vin) \cdot (1 - A2 \cdot vgc/2)/4$$

Drain current I33 of the FET 33 is derived by:

$$I33 = I36 \cdot (1 - A2 \cdot vgc/2)/2 \qquad (15)$$
$$= i \cdot (1 - A1 \cdot vin) \cdot (1 - A2 \cdot vgc/2)/4$$

Drain current I34 of the FET 34 is derived by:

$$I34 = I36 \cdot (1 + A2 \cdot vgc/2)/2 \qquad (16)$$
$$= i \cdot (1 - A1 \cdot vin) \cdot (1 + A2 \cdot vgc/2)/4$$

Further, the current I21 flowing to the load resistor 21 is the sum of the FET 31's drain current I31 and the FET 33's drain current I33, and that value becomes as follows due to Equations (13) and (15):

$$I21 = I31 + I33 \qquad (17)$$
$$= i \cdot (1 + A1 \cdot A2 \cdot vin \cdot vgc/2)/2$$

Further, the current I21 flowing to the load resistor 21 is the sum of the FET 32's drain current I32 and the FET 34's drain current I34, and that value becomes as follows due to Equations (14) and (16):

$$I22 = I32 + I34 \qquad (18)$$
$$= i \cdot (1 - A1 \cdot A2 \cdot vin \cdot vgc/2)/2$$

Accordingly, if the change from the time where the vout vgc=0 of the second output signal (e.g., output signal voltage) outputted from the positive-phase signal output terminal OUT is made Δ vout, then Δ vout becomes:

$$\Delta vout = r \cdot A1 \cdot A2 \cdot vin \cdot vgc/4 \quad (19)$$

When the change from the time where the voutb vgc=0 of the first output signal (e.g., output signal voltage) outputted from the reverse-phase signal output terminal OUTB is made Δ voutb, then Δ voutb becomes:

$$\Delta voutb = -r \cdot A1 \cdot A2 \cdot vin \cdot vgc/4 \quad (20)$$

This type of circuit with the above-described configuration acts as a gain variable circuit where the gain has been varied due to the vgc difference of the voltage vgc1, vgc2 applied to the gain variable terminals VGC1 and VGC2.

Effect of the First Embodiment

With the first embodiment, the invention is configured with two tiers of vertical stacks comprising the FETs 35, 36 of the source ground circuit for signal amplification and FETs 31-34 of the differential circuit for gain variation and load resistors 21, 22. For this reason, there is an effect that when compared to conventional devices, the number of elements can be reduced by one. Further, since the FET operates, when the voltage between the necessary drain sources is Vds and the voltage applied to the load resistors 21, 22 is Vr, the minimum supply voltage Vmin deemed necessary becomes Vmin=2·Vds+Vr, so compared to conventional gain variable circuits, there is an effect in that the supply voltage can be lowered by one tier portion only of the FET.

Note that in the first embodiment, a source ground circuit consisting of FETs 35, 36 for signal amplification is used so, for example, when the input signal voltage –vin applied to the reverse-phase signal input terminal INB is fixed voltage and the input signal voltage vin applied to the positive-phase signal input terminal IN is variable voltage, single balance conversion does not occur with the source ground circuit for amplifying signals. For this reason, two input signals are limited to differential input. Nonetheless, multiple tiers of amps are usually connected to this type of gain variable circuit so it is not often that the differential input limit becomes a problem, and compared to this type of disadvantage, the above-described effects are more prevalent.

Second Embodiment

FIG. 2 is a circuit diagram of a gain variable circuit showing the second embodiment of the present invention. The elements that are the same as in FIG. 1 showing the first embodiment have been assigned the same symbol numbers.

In FIG. 1 of the first embodiment, explanations were made regarding a gain variable circuit operating with a positive power supply, however, the second embodiment shows a circuit configuration when using a negative power supply. With the gain variable circuit of the second embodiment, one of the terminals of load resistors 21, 22 is connected to ground GND and the source of FETs 35, 36 is connected to a negative supply terminal VSS, Further, the VGC1 and VGC2 of the gain variable terminal are reciprocally shifted. Even if the circuit is thus configured, an operational effect that is almost entirely the same as that of the first embodiment can be obtained.

Third Embodiment

Configuration of Third Embodiment

Figure 3:
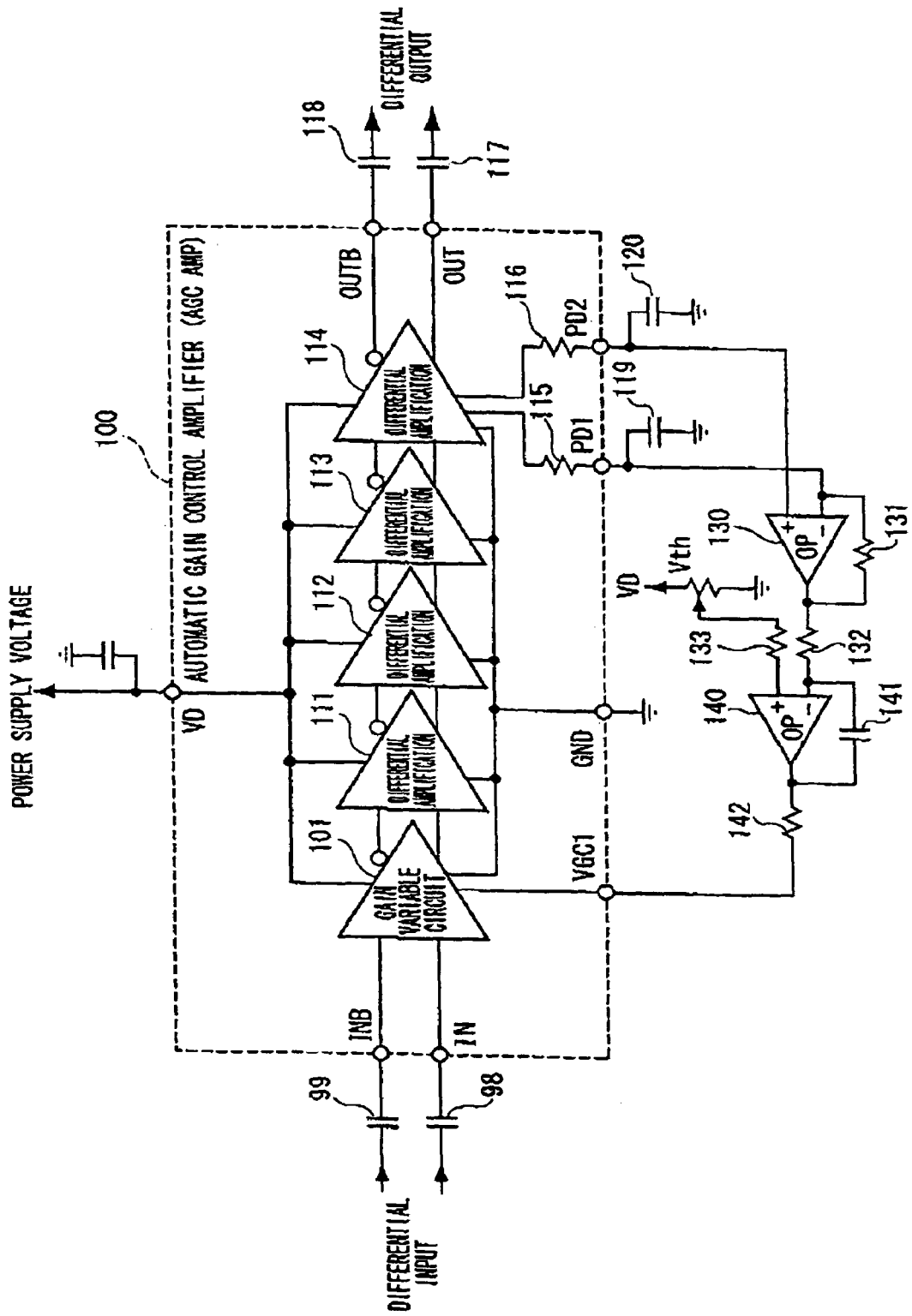
FIG. 3 is a circuit diagram of an AGC amp showing the third embodiment of the present invention.
Figure 4:
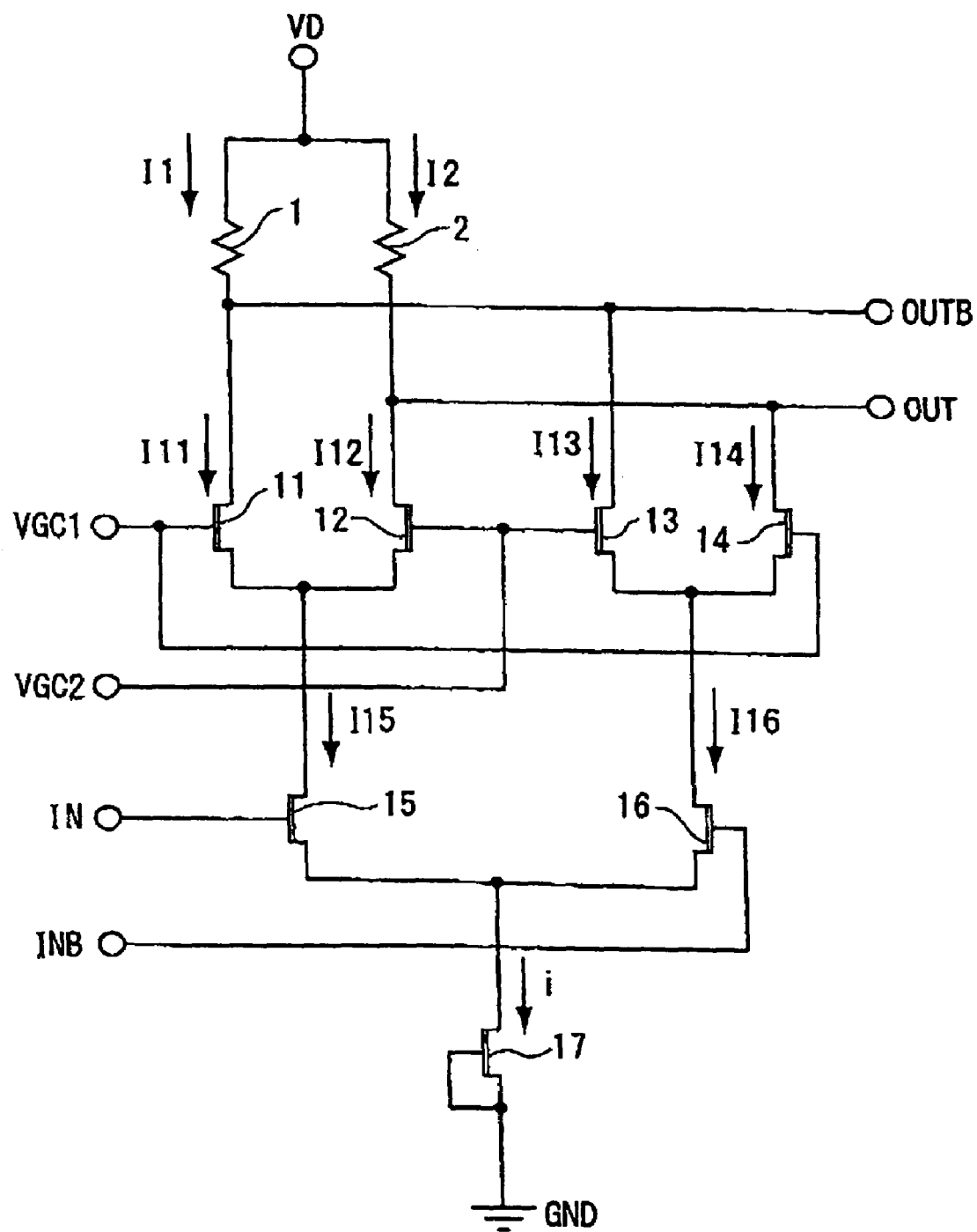
FIG. 4 is a circuit diagram showing a conventional gain variable circuit.

FIG. 3 is a circuit diagram of an AGC amp showing the third embodiment of the present invention.

The third embodiment shows an AGC amp as an applicable example of a variable gain circuit of the first or second embodiment. This AGC amp 100 has a positive-phase signal input terminal IN and a reverse-phase signal input terminal INB into which a differential input signal is inputted via blocking capacitors 98, 99; and a variable gain circuit 101 of the first grade of the first or second embodiments connected to these input terminals IN, INB; and at the side of the second part, multileveled (e.g., four tiers) differential amplification circuits 111-114 of fixed gain are connected. A peak detection circuit that detects amplitude of output is provided inside the differential amplitude circuit 114 of the very last part, and detection signals from this peak detection circuit are outputted to terminals PD1, PD2 via resistors 115, 116. Here, the difference between the third and fourth output signals (e.g., differential output amplitude) outputted via blocking capacitors 117, 118 from the positive-phase signal output terminal OUT and the reverse-phase signal output terminal OUTB connected to the output terminal of the differential amplification circuit 114 and the difference of the detection signals outputted from the terminals PD1 and PD2 (i.e., the difference between PD1 and PD2) are made to be a relationship of proportion.

An integral value is outputted from the terminals PD1, PD2 by resistors 115, 116 and integral capacities 119, 120. This integral value is amplified by, e.g., two-tier operation amplification circuits 130, 140 (hereafter, "op-amp") which are feedback circuits. A feedback resistor 131 is connected between the output terminals of the op-amp 130. The output signal of this op-amp 130 and a standard voltage Vth are passed to the op-amp 140 via input resistors 132, 133. A feedback resistor 141 is connected between the output terminals of the op-amp 140. The output signal of this op-amp 140 is fed back and inputted to the gain variable terminal VGC1 of the gain variable circuit 101 via an output resistor 142. Fixed constant voltage is applied to the gain variable terminal VGC2 of the gain variable circuit 101.

Effect of the Third Embodiment

When the differential input signal is inputted to the input terminals IN, INB via blocking capacitors 98, 99, this differential input signal is amplified only by the amount of circuit gain (i.e., the gain of the gain variable circuit 101 and the gain of the differential amplification circuits 111-114 at the later stage), then the differential input signal is outputted from the output terminals OUT, OUTB via the blocking capacitors 117, 118. Here, in the case where the circuit gain is a constant value, when the amplitude of the differential input signal changes, then the amplitude of the differential output signal also changes.

In the case of the AGC amp 100, when the differential input signal enlarges and the difference of the detection value of the differential output amplitude outputted from the terminal PD1 and PD2 increases, the voltage of the gain variable terminal VGC1 increases and the gain of the gain variable circuit 101 decreases, whereby the circuit gain is made to reduce. On the other hand, when the differential output amplitude is small, the device functions so that the voltage of the gain variable terminal VGC1 reduces and the circuit gain rises. The gain changes so that the differential output amplitude becomes constant in response to this type of change in the differential input amplitude.

Effect of the Third Embodiment

With the AGC amp 100 of the third embodiment, the gain variable circuit 101 of the first or second embodiment is provided at the first stage so the power voltage of the entire AGC amp applied to the supply terminal VD can be reduced. For this reason, when the AGC amp 100 is formed from a circuit such as an integrated circuit, a lower consumption of electrical power is possible due to the low-voltage operation, whereby the circuit can be made more compact due to reductions in the numbers of elements.

Note that the present invention is not limited to the above-described first through third embodiments, and various forms and modes of use are possible. Examples of these forms and modes of use include examples such as the ones disclosed in the following.

(a) In FIGS. 1 and 2, the gain variable circuits are configured using FET, however, an operational effect almost entirely the same as described in the above embodiments can be obtained even if the circuit is configured using another transistor, such as a bipolar transistor. For example, when the gain variable circuits in FIGS. 1 and 2 are configured using a bipolar transistor, another circuit such as an emitter ground circuit and the like can be provided in place of the source ground circuit for signal amplification made from the FETs 35, 36.

(b) The gain variable circuits in FIGS. 1 and 2 can be provided with a load transistor and the like in place of the load resistors 21, 22.

(c) The gain variable circuits in FIGS. 1 and 2 can be applied to (i.e., have various applications) besides just the AGC amp of FIG. 3.

What is claimed is:

1. A gain variable circuit comprising:
a first load connected between a first supply voltage node, and a first output terminal that outputs a first output signal;
a second load connected between the first supply voltage node, and a second output terminal that outputs a second output signal having phase reversed from a phase of the first output signal;
a first differential circuit that is connected between the first and second output terminals and a first node, and that changes gains of the first and second output signals responsive to a difference between first and second complementary gain variable signals;
a second differential circuit that is connected between the first and second output terminals and a second node, and that changes the gains of the first and second output signals responsive to a difference between the first and second gain variable signals; and
an amplification circuit that is connected between the first and second nodes and a second supply voltage node, and that amplifies the first and second output signals responsive to a difference between first and second complementary input signals,
wherein the first differential circuit comprises
a first transistor that is connected between the first output terminal and the first node, and that has a state of conduction controlled by the first gain variable signal, and
a second transistor that is connected between the second output terminal and the first node, and that has a state of conduction controlled by the second gain variable signal, and
the second differential circuit comprises
a third transistor that is connected between the first output terminal and the second node, and that has a state of conduction controlled by the second gain variable signal, and
a fourth transistor that is connected between the second output terminal and the second node, and that has a state of conduction controlled by the first gain variable signal.

2. The gain variable circuit of claim 1, wherein the amplification circuit comprises:
a fifth transistor that is connected between the first node and the second supply voltage node, and that has a state of conduction controlled by the first input signal; and
a sixth transistor that is connected between the second node and the second supply voltage node, and that has a state of conduction controlled by the second input signal.

3. The gain variable circuit of claim 2, wherein the first and second loads have a same resistance value; the first, second, third, and fourth transistors have the same transistor characteristics; and the fifth and sixth transistors have the same transistor characteristics.

4. The gain variable circuit of claim 1, wherein the first and second loads are resistors.

5. The gain variable circuit of claim 1, wherein the first and second loads are transistors.

6. An automatic gain control amplifier comprising:
the gain variable circuit of claim 1;
a one-tier or multiple-tiered differential amplification circuit that differentially amplifies the first and second output signals of the gain variable circuit and outputs complementary third and fourth output signals; and
a feedback circuit that feeds back and inputs an amount of variation of the third and fourth output signals to the gain variable circuit as the first and second gain variable signals.

* * * * *